(12) United States Patent
Wang et al.

(10) Patent No.: US 8,748,267 B2
(45) Date of Patent: Jun. 10, 2014

(54) METHOD FOR MANUFACTURING A TUNNELING FIELD EFFECT TRANSISTOR WITH A U-SHAPED CHANNEL

(75) Inventors: Pengfei Wang, Shanghai (CN); Xi Lin, Shanghai (CN); Wei Liu, Shanghai (CN); Qingqing Sun, Shanghai (CN); Wei Zhang, Shanghai (CN)

(73) Assignee: FUDAN University, Shanghai (CN)

( * ) Notice: Subject to any disclaimer, the term of this patent is extended or adjusted under 35 U.S.C. 154(b) by 171 days.

(21) Appl. No.: 13/537,956

(22) Filed: Jun. 29, 2012

(65) Prior Publication Data

US 2013/0149824 A1 Jun. 13, 2013

(30) Foreign Application Priority Data

Dec. 12, 2011 (CN) .......................... 2011 1 0410865

(51) Int. Cl.
*H01L 21/336* (2006.01)

(52) U.S. Cl.
USPC ................... 438/270; 438/589; 257/E21.419; 257/E21.428; 257/E21.429; 257/E21.655

(58) Field of Classification Search
CPC .............. H01L 29/7391; H01L 29/772; H01L 27/10823; H01L 27/10876; H01L 29/1037; H01L 29/42336; H01L 29/42352; H01L 29/4236; H01L 29/7813

USPC .......... 438/270, 589; 257/330, 332, E21.419, 257/E21.428, E21.429, E21.655
See application file for complete search history.

(56) References Cited

U.S. PATENT DOCUMENTS

| | | | | |
|---|---|---|---|---|
| 8,299,517 | B2 * | 10/2012 | Jang et al. | 257/306 |
| 8,357,965 | B2 * | 1/2013 | Nansei | 257/314 |
| 2007/0117329 | A1 * | 5/2007 | Inagawa et al. | 438/270 |
| 2008/0277709 | A1 * | 11/2008 | Lee et al. | 257/301 |
| 2012/0261744 | A1 * | 10/2012 | Wang et al. | 257/329 |
| 2012/0276703 | A1 * | 11/2012 | Grivna | 438/270 |
| 2013/0224919 | A1 * | 8/2013 | Ding et al. | 438/270 |
| 2014/0015039 | A1 * | 1/2014 | Hossain | 257/330 |

* cited by examiner

*Primary Examiner* — William F Kraig
*Assistant Examiner* — Joseph C Nicely
(74) *Attorney, Agent, or Firm* — Merchant & Gould P.C.

(57) ABSTRACT

The present invention belongs to the technical field of semiconductor device manufacturing and specifically relates to a method for manufacturing a tunneling field effect transistor with a U-shaped channel. The U-shaped channel can effectively extend the transistor channel length, restrain the generation of leakage current in the transistor, and decrease the chip power consumption. The method for manufacturing a tunneling field effect transistor with a U-shaped channel put forward in the present invention is capable of realizing an extremely narrow U-shaped channel, overcoming the alignment deviation introduced by photoetching, and improving the chip integration degree.

8 Claims, 6 Drawing Sheets

METHOD FOR MANUFACTURING A TUNNELING FIELD EFFECT TRANSISTOR WITH A U-SHAPED CHANNEL

This application claims benefit of Serial No. 201110410865.1, filed 12 Dec. 2011 in China and which application is incorporated herein by reference. To the extent appropriate, a claim of priority is made to the above disclosed application.

BACKGROUND OF THE INVENTION

1. Technical Field

The present invention belongs to the technical field of semiconductor device manufacturing, relates to a method for manufacturing a tunneling field effect transistor, and more especially, to a method for manufacturing a tunneling field effect transistor with a U-shaped channel.

2. Description of Related Art

In recent years, the microelectronic technology with silicon integrated circuits as their core has developed rapidly, and the development of the integrated circuit chip has basically followed Moore's law, namely the integration degree of semiconductor chips increases at a speed of doubling every 18 months. However, with the increase of the integration degree of semiconductor chips, the channel length of MOS transistors is also continuously reducing, and the semiconductor chip performances will decline, or even be unable to work due to the short channel effect when the channel length of the MOS transistor becomes extremely short.

The tunneling field effect transistor is a kind of transistor with an extremely small leakage current, which can further minimize the circuit size and decrease voltage, thus reducing the chip power consumption significantly. By using the tunneling field effect transistor with a U-shaped channel structure, the transistor channel length can be effectively extended, thus further restraining the generation of leakage current in the transistor. Therefore, the tunneling field effect transistor with a U-shaped channel has been widely used. The traditional tunneling field effect transistor with a U-shaped channel is as shown in FIG. 1, wherein the tunneling transistor 10 includes a source region 12, a drain region 13, a substrate region 11 and a stacked gate region composed of a gate dielectric layer 14 and a gate conductive layer 15. The sidewall 16 of the stacked gate region is an insulator of, for example, $Si_3N_4$ material, which insulates the conductive gate layer from other conductive layers of the device. The impurity concentration of the substrate 11 is of light doping, the source region 12 and the drain region 13 are of heavy doping, and are of contrary doping types. The insulation layer 17 is the device passivation layer, which isolates the device from other devices and protects the device form the influence of the outside world. The conductive layer 18 is of metallic material and used as the device electrode.

At present, the U-shaped channel of a tunneling field effect transistor is usually realized by forming a silicon oxide film on the provided substrate, then forming a layer of photoresist with a pattern on the silicon oxide film and etching the silicon oxide film and the semiconductor substrate to form a U-shaped device channel. As described above, when manufacturing a U-shape device channel, a layer of photoresist with a pattern will be formed, which will introduce the misalignment of pattern, causing the product manufacturing yield be reduced. In addition, the manufacturing of narrow U-shaped channel is also a difficult point.

BRIEF SUMMARY OF THE INVENTION

The present invention aims at putting forward a method for manufacturing a tunneling field effect transistor with a U-shaped channel, which can improve the product manufacturing yield as well as realize the manufacturing of narrow U-shaped channel.

The method for manufacturing a tunneling field effect transistor with a U-shaped channel put forward by the present invention includes the following steps:

provide a semiconductor substrate;

form a first doping region of a first doping type in the semiconductor substrate;

form a first kind of insulation film on the semiconductor substrate;

etch the first kind of insulation film and the semiconductor substrate to form a pattern;

form a second kind of insulation film through deposition and etch the second kind of insulation film to form a sidewall;

form a third kind of insulation film on the substrate exposed through oxidation;

remove the second kind of insulation film;

etch the substrate along the sidewalls of the first and second kinds of insulation film to form a groove;

cover the groove to form a fourth kind of insulation film;

cover the fourth kind of insulation film to form a first kind of conductive film;

etch the first kind of conductive film to form a device gate conductive layer;

cover the gate conductive layer to form a gate protection layer;

etch the fourth and third kinds of insulation film to expose the substrate;

etch the substrate exposed to form a region for the subsequent development;

form a second doping region of the first doping type in the semiconductor substrate;

cover the second doping region of the first doping type to form a fifth kind of insulation film;

cover the fifth kind of insulation film to form a source region of a second doping type;

etch the gate protection layer to form a gate sidewall;

Deposit a sixth kind of insulation film to form a device passivation layer and etch the passivation layer to form a contact hole;

deposit a second kind of conductive film and etch the second kind of conductive film to form electrodes.

Further, the semiconductor substrate is of silicon or silicon on insulation (SOI). The first, third and sixth kinds of insulation film are of silicon oxide. The fourth and fifth kinds of insulation film are of silicon oxide or high-dielectric constant materials such as $HfO_2$. The second kind of insulation film and the gate protection layer are formed of silicon oxide.

The first kind of conductive film is of doped polycrystalline silicon with a doping type of n-type or p-type doping. The second kind of conductive film is of metallic aluminum, tungsten or other metallic conductive materials.

Furthermore, the first doping type is n type, the second doping type is p type; or the first doping type is p type and the second doping type is n type.

The U-shaped channel can effectively extend the transistor channel length, restrain the generation of leakage current in the transistor and decrease the chip power consumption. The method for manufacturing a tunneling field effect transistor with a U-shaped channel put forward in the present invention is capable of realizing an extremely narrow U-shaped channel, overcoming the alignment deviation introduced by photoetching and improving the chip integration degree.

DETAILED DESCRIPTION OF THE INVENTION

Figure 1:
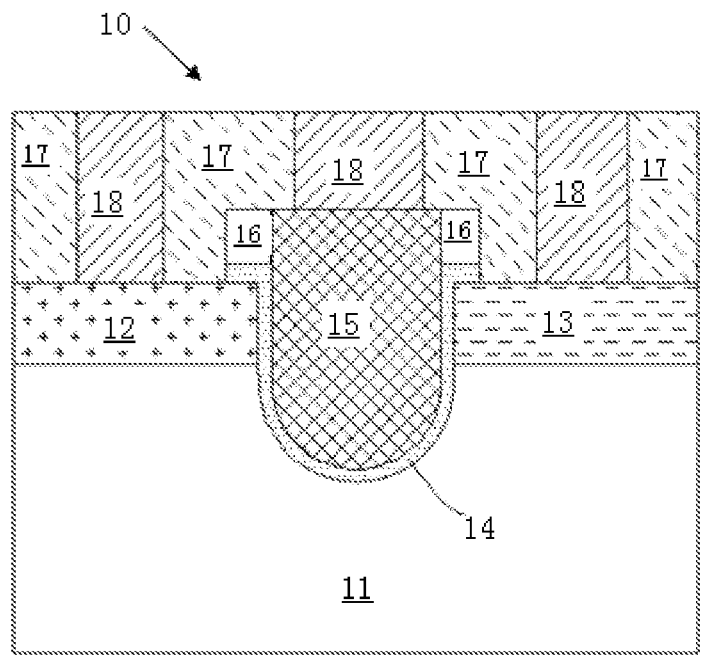
FIG. 1 is the sectional view of the traditional tunneling field effect transistor with a U-shaped channel.

An exemplary embodiment of the present invention is further detailed herein by referring to the drawings. In the drawings, the thicknesses of the layers and regions are either zoomed in for the convenience of description, so they shall not be considered as the true size. Although these drawings cannot accurately reflect the true size, they still reflect the relative positions among the regions and components completely, especially the up-down and adjacent relations.

The reference diagrams are the schematic diagrams of the idealized embodiments of the present invention, so the embodiments shown in the present invention shall not be limited to specific shapes in areas shown in the drawings, while they shall include the obtained shapes such as the deviation caused by manufacturing. For instance, curves obtained through etching are often bent or rounded, while in the embodiments of the present invention, they are all presented in rectangles, and what the drawings present is schematic and shall not be considered as the limit to the present invention.

Figure 2:
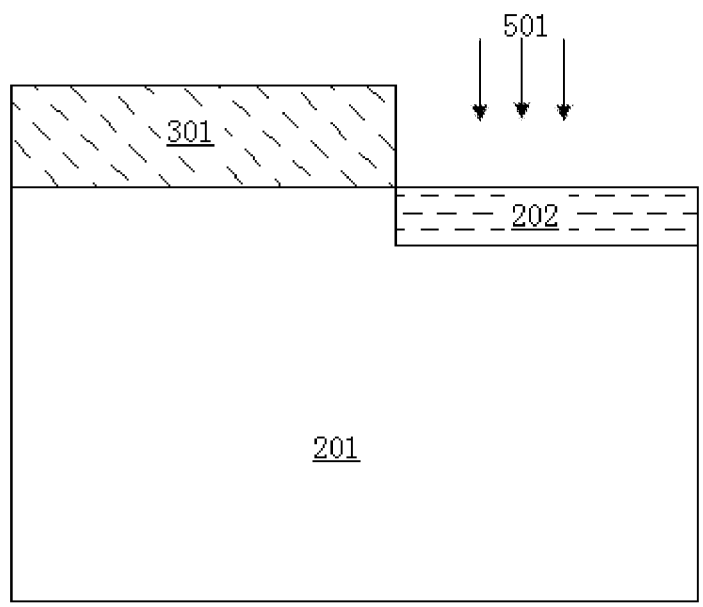
FIGS. 2-12 are the process flow diagrams of an embodiment of the method for manufacturing a tunneling field effect transistor put forward by the present invention.

Firstly, deposit a layer of photoresist 301 on a silicon substrate 201 provided, then form a pattern through masking film, exposal and development, and form an n-type doping region 202 in the silicon substrate 201 through the ion implantation method, as shown in FIG. 2, wherein the 501 shown represents a particle beam.

Figure 3:
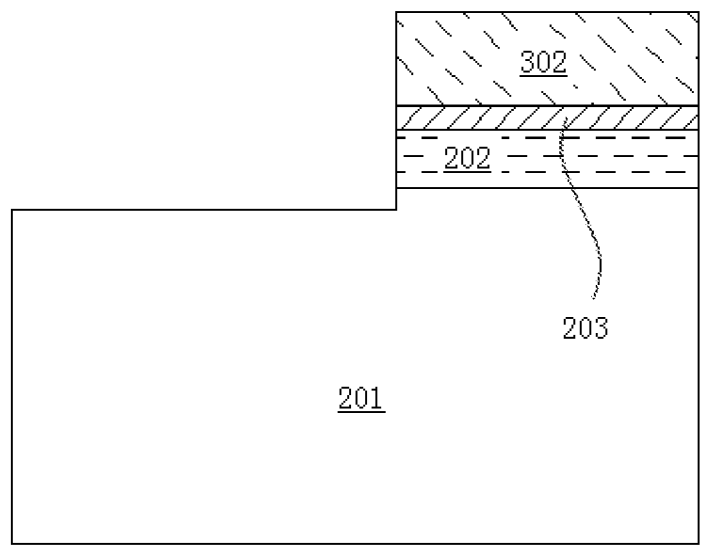

After removing the photoresist 301, form a silicon oxide film 203 on the silicon substrate 201 through spin-coating or oxidation, then form a layer of photoresist 302 with a pattern on the silicon oxide film 203, and etch the silicon oxide film 203 and the silicon substrate 201 to form a pattern, as shown in FIG. 3.

Figure 4:
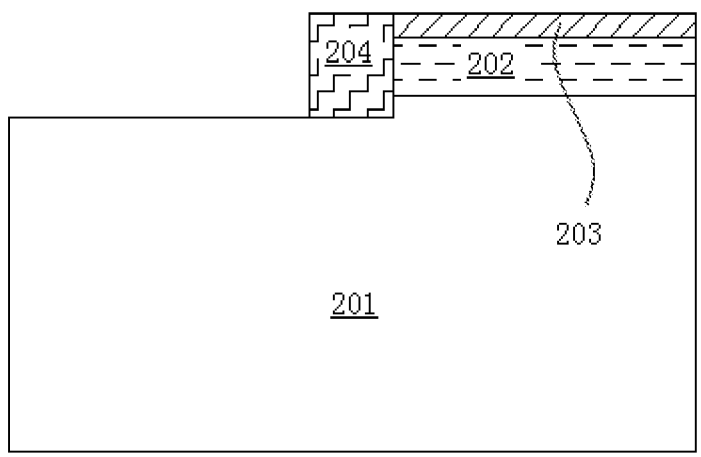
Figure 5:
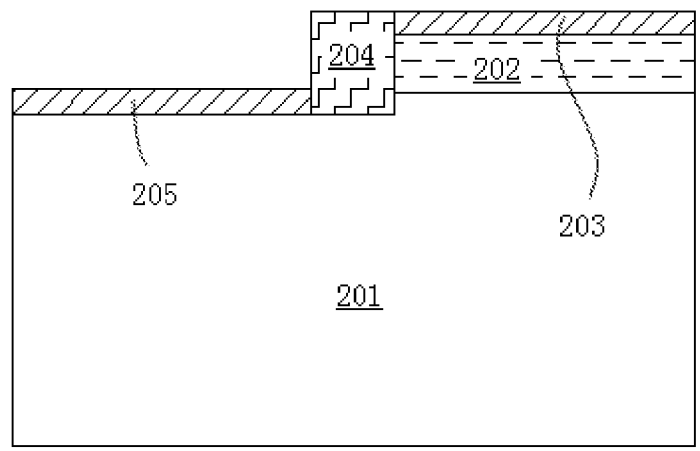

After removing the photoresist 302, deposit a layer of silicon nitride film and etch the silicon nitride film to form a sidewall 204, as shown in FIG. 4. Then develop a silicon oxide film 205 on the substrate surface by means of oxidation through the wet-oxygen oxidation method, as shown in FIG. 5.

Figure 6:
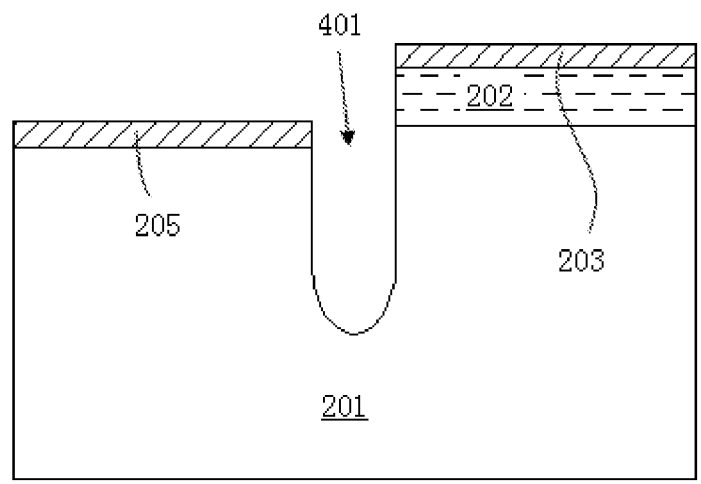

Next, remove the silicon nitride sidewall 204 and etch the silicon substrate 201 along the sidewalls of the silicon oxide film 203 and 205 to form a groove 401, as shown in FIG. 6.

Figure 7:
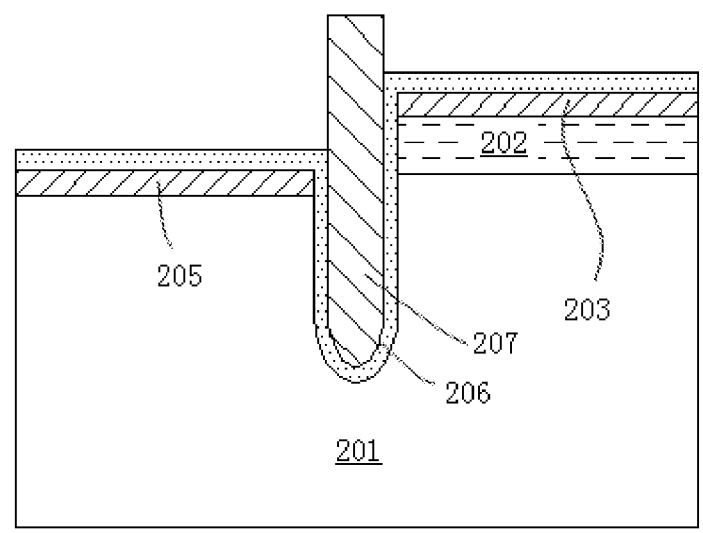
Figure 8:
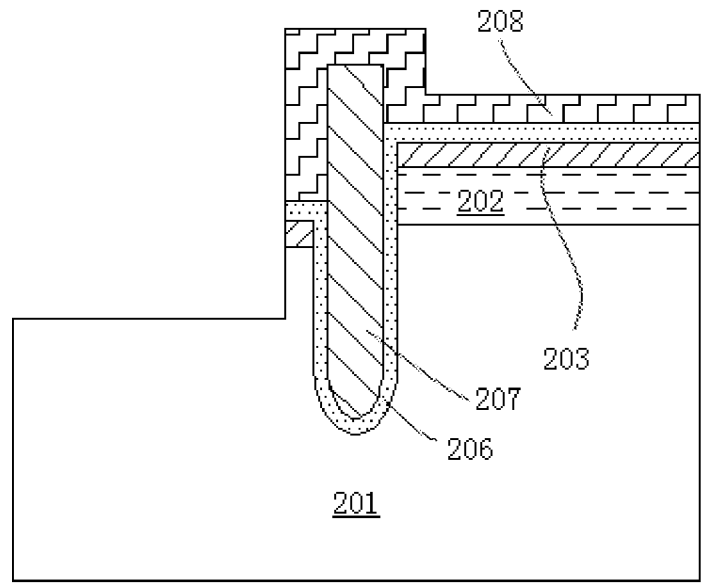

After forming the groove 401, deposit a layer of high dielectric constant material 206 such as $HfO_2$, then deposit a doped polycrystalline silicon film 207 with a doping type of n type or p type, and etch the polycrystalline silicon film 207 to form a device gate conductive layer, as shown in FIG. 7. Next, deposit a silicon oxide film, etch the silicon oxide film to form a gate protection layer 208, then etch the $HfO_2$ material layer 206 and the silicon oxide film 205 along the sidewall of the silicon nitride protection layer to expose the substrate and continue to etch the substrate 201 to form a pattern, as shown in FIG. 8.

Figure 9:
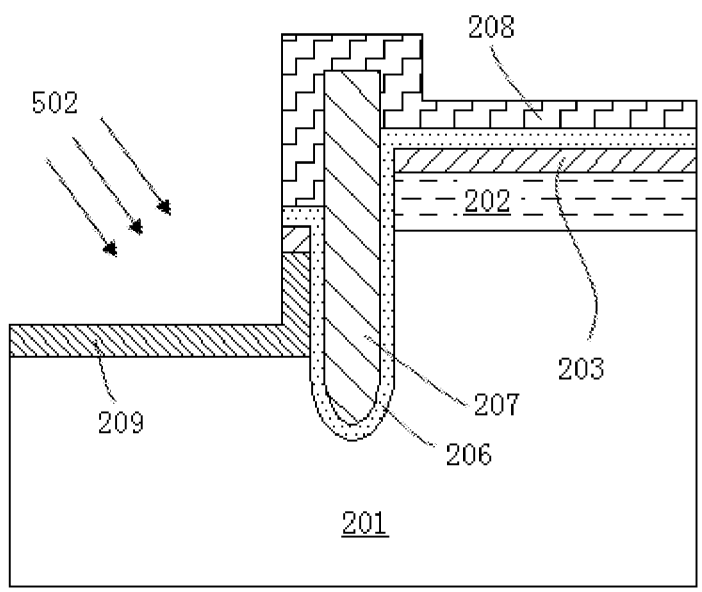

Next, form an n-type doping region 209 in the substrate 201 through the angled ion implantation method, as shown in FIG. 9, wherein the 502 shown is a particle beam.

Figure 10:
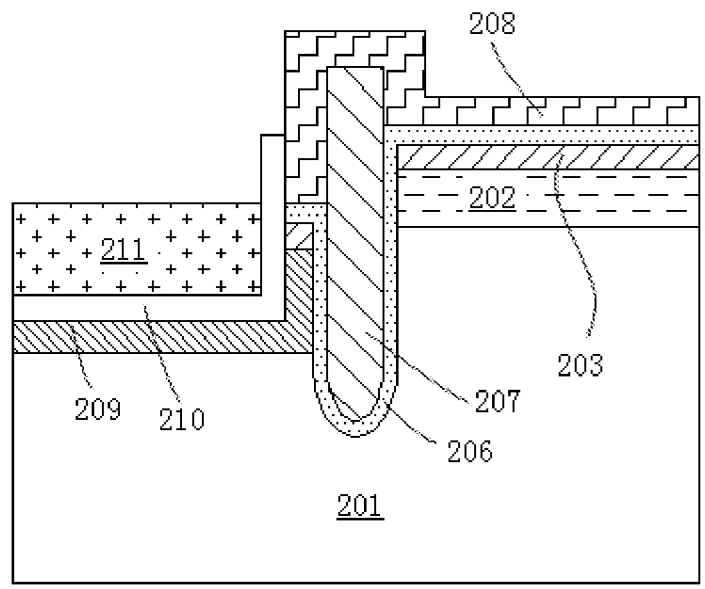

Next, form an insulation film 210, which can be of alumina, silicon oxide or high dielectric constant materials such as $HfO_2$, on the n-type doping region 209. Then form a semiconductor layer 211, for instance, of polycrystalline silicon, with a doping type of p type on the insulation film 210, as shown in FIG. 10.

Figure 11:
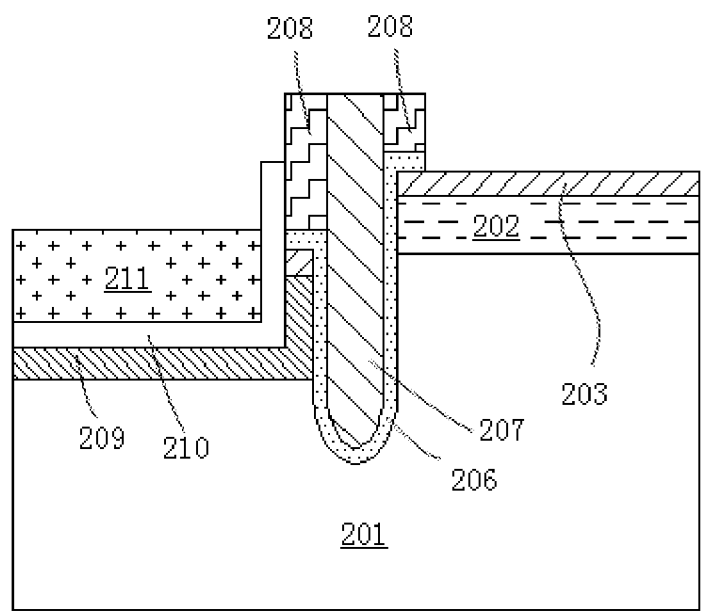

Next, etch the silicon nitride protection layer 208 to form a gate sidewall and etch out the exposed $HfO_2$ film along the edge of the gate sidewall, as shown in FIG. 11.

Figure 12:
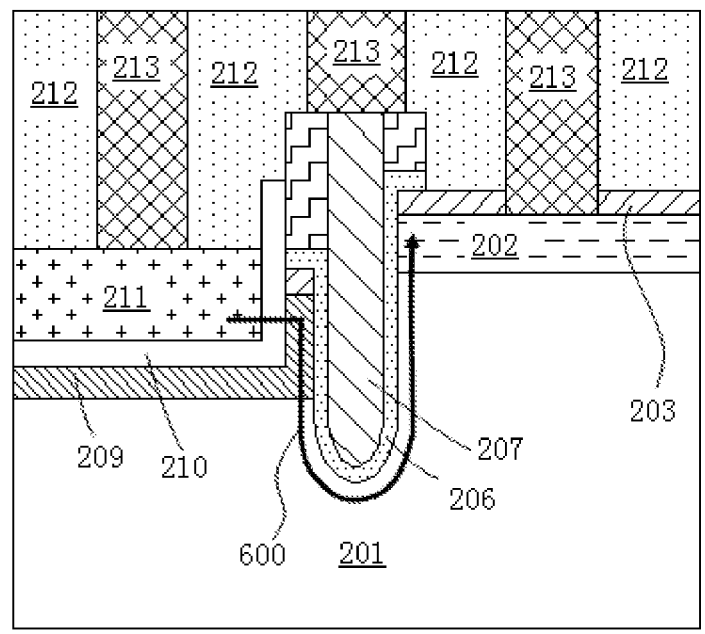

Finally, deposit a silicon oxide film 212 and form a contact hole through photoetching and etching. Then deposit a layer of metal which can be aluminum or tungsten, and form a metal electrode 213 through etching. When the device is power-on, the current in the device will pass through the insulation layer 210, the n-type doping region 209, the substrate region 201 to the drain region 202 as indicated by the line 600, as shown in FIG. 12.

As described above, without deviating from the spirit and scope of the present invention, there may be many significantly different embodiments. It shall be understood that the present invention is not limited to the specific embodiments described in the Specification except those limited by the Claims herein.

What is claimed is:

1. A method for manufacturing a tunneling field effect transistor with a U-shaped channel, wherein it comprises the following steps:
   provide a semiconductor substrate;
   form a first doping region of a first doping type in the semiconductor substrate;
   form a first kind of insulation film on the semiconductor substrate;
   etch the first kind of insulation film and the semiconductor substrate to form a pattern;
   deposit a second kind of insulation film and etch the second kind of insulation film to form a sidewall and expose the substrate;
   form a third kind of insulation film on the substrate exposed through oxidation;
   remove the second kind of insulation film;
   etch the substrate along exposed sidewalls of the first and third kinds of insulation film to form a groove;
   cover the groove with a fourth kind of insulation film;
   cover the fourth kind of insulation film with a first kind of conductive film;
   etch the first kind of conductive film to form a device gate conductive layer;
   cover the gate conductive layer with a gate protection layer;
   etch the fourth and third kinds of insulation film to expose the substrate;
   etch the substrate exposed to form a region for subsequent development;
   form a second doping region of the first doping type in the semiconductor substrate;
   cover the second doping region of the first doping type with a fifth kind of insulation film;
   cover the fifth kind of insulation film with a conductive material to form a source region of a second doping type;
   etch the gate protection layer to form a gate sidewall;
   deposit a sixth kind of insulation film to form a device passivation layer;
   etch the sixth kind of insulation film to form a contact hole;
   deposit a second kind of conductive film and etch the second kind of conductive film to form an electrode.

2. The method for manufacturing a tunneling field effect transistor with a U-shaped channel according to claim 1, wherein the semiconductor substrate is of silicon or silicon on insulator.

3. The method for manufacturing a tunneling field effect transistor with a U-shaped channel according to claim 1, wherein the first, third and sixth kinds of insulation film are of silicon oxide.

4. The method for manufacturing a tunneling field effect transistor with a U-shaped channel according to claim 1, wherein the fourth and fifth kinds of insulation film are of silicon oxide or high-dielectric constant material $HfO_2$.

5. The method for manufacturing a tunneling field effect transistor with a U-shaped channel according to claim 1, wherein the second kind of insulation film and the gate protection layer are formed of silicon nitride material.

6. The method for manufacturing a tunneling field effect transistor with a U-shaped channel according to claim 1, wherein the first doping type is n type, the second doping type is p type; or the first doping type is p type and the second doping type is n type.

7. The method for manufacturing a tunneling field effect transistor with a U-shaped channel according to claim 1, wherein the first kind of conductive film is of doped polycrystalline silicon with a doping type of n-type or p-type doping.

8. The method for manufacturing a tunneling field effect transistor with a U-shaped channel according to claim 1, wherein the second kind of conductive film is of metallic aluminum or tungsten.

\* \* \* \* \*